United States Patent [19]

Pfeifer et al.

[11] Patent Number: 4,847,359
[45] Date of Patent: Jul. 11, 1989

[54] DIAMINO-9,10-DIHYDROANTHRACENES AND POLYAMIDE ACID (ESTERS) AND POLYIMIDES DERIVED THEREFROM

[75] Inventors: Josef Pfeifer, Therwil; Rudolf Duthaler, Bettingen, both of Switzerland

[73] Assignee: Ciba-Geigy Corporation, Ardsley, N.Y.

[21] Appl. No.: 63,881

[22] Filed: Jun. 19, 1987

[30] Foreign Application Priority Data

Jun. 30, 1986 [CH] Switzerland .................. 2618/86

[51] Int. Cl.[4] .............................. C08G 69/26
[52] U.S. Cl. .................... 528/353; 528/125; 528/126; 528/128; 528/172; 528/185; 528/188; 528/229; 528/352; 522/164; 430/283; 430/325
[58] Field of Search ............. 528/353, 125, 126, 128, 528/172, 185, 188, 229, 352; 430/283, 325; 522/164

[56] References Cited

U.S. PATENT DOCUMENTS

| | | | |
|---|---|---|---|
| 3,963,762 | 6/1976 | Hohmann | 528/353 |
| 4,629,777 | 12/1986 | Pfeifer | 528/353 |
| 4,657,832 | 4/1987 | Pfeifer | 528/353 |
| 4,680,195 | 7/1987 | Pfeifer | 528/353 |

OTHER PUBLICATIONS

R. A. Dine-Hart, Makromol. Chem., 153, 237 (1972).

Primary Examiner—John Kight
Assistant Examiner—M. L. Moonan
Attorney, Agent, or Firm—Luther A. R. Hall; Stephen V. O'Brien; Harry Falber

[57] ABSTRACT

Compounds containing at least 5 mol % of structural units of the formulae I and/or II

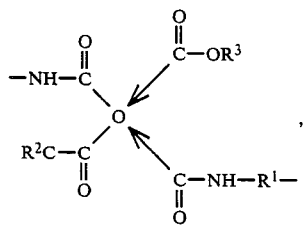
(I)

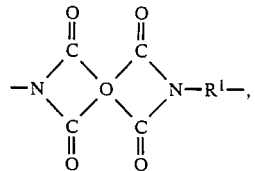

(II)

in which Q is an unsubstituted or substituted tetravalent aromatic radical to which in each case two carbonyl groups are bonded in the ortho- or peri-position, $R^1$ is selected from the radicals of the formulae III, IV and V

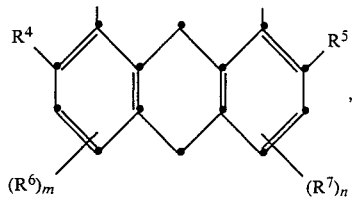
(III)

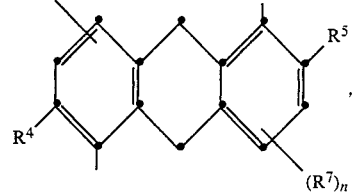

(IV)

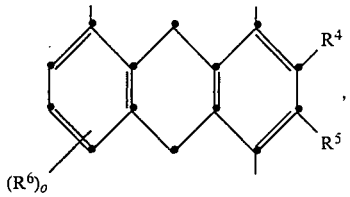

(V)

$R^2$, $R^3$, $R^4$ and $R^5$ are hydrogen, alkyl, cycloalkyl or substituted or unsubstituted aryl or aralkyl, $R^6$ and $R^7$ are aryl or halogen, m and n are 0, 1 or 2 and o is 0, 1, 2, 3 or 4, are described.

The compounds are distinguished by an increased resistance to oxidation by heat. They can be used to produce coatings and relief structures.

16 Claims, No Drawings

DIAMINO-9,10-DIHYDROANTHRACENES AND POLYAMIDE ACID (ESTERS) AND POLYIMIDES DERIVED THEREFROM

The present invention relates to polyamide acid (esters) and polyimides containing structural units of certain 9,10-dihydroanthracenes, the diamino-9,10-dihydroanthracene intermediates, coating agents containing these polymers, the use of these polymers for the production of heat-stable coatings, films and relief structures and the coatings, films and relief structures obtainable by radiation-crosslinking these polymers.

Polyimides and their polyamide acid precursors are known to be suitable for the production of highly heat-stable coatings. Polyimides which are soluble and at the same time can be crosslinked by radiation are particularly in demand in the electronics industry sector, and are used there, for example, as mask materials or as protective coatings. Such polyimides are described, for example, in EP-A-No. 134,752. Polyimides which are soluble and at the same time autophotocrosslinkable and are derived from aromatic diamines substituted in the two ortho-positions relative to at least one amino group are furthermore known from EP-A-Nos. 132,221 and 162,017. The polymers have a minimum content of benzophenonetetracarboxylic acid units or of units of other aromatic tetracarboxylic acids in which the aromatic radicals containing carboxyl groups are bonded to further aromatic radicals via carbonyl groups.

The incorporation of alkyl groups into the diamine portion of a polyimide as a rule improves the solubility of the polymer; however, at the same time the stability to oxidation by heat decreases. The maximum possible heat stabilities are required for the abovementioned purposes. It has now been found that an improved stability at high temperatures, in particular to oxidative degradation by heat, can be achieved by incorporation of certain 9,10-dihydroanthracene units into polyimides, their polyamide acid precursors or esters derived therefrom.

The present invention relates to homo- or copolyamide acid (esters) and homo- or copolyimides derived therefrom containing at least 5 mol % of structural units of the formula I and/or II

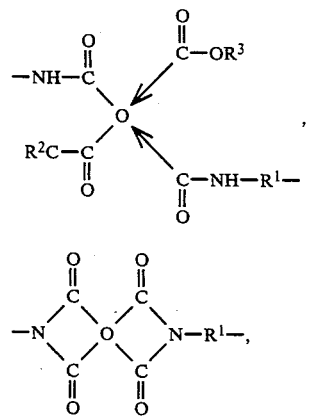

in which Q is an unsubstituted or substituted tetravalent aromatic radical to which in each case two carbonyl groups are bonded in the ortho- or peri-position, $R^1$ is selected from the group consisting of radicals of the formulae III, IV and V

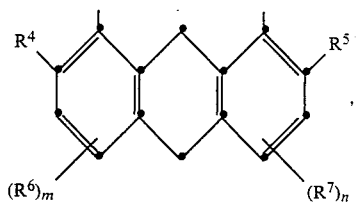

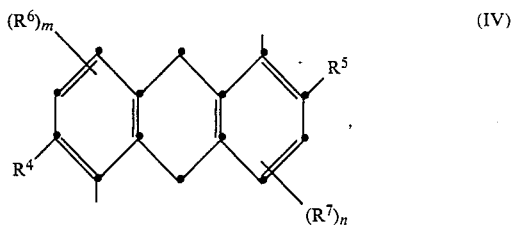

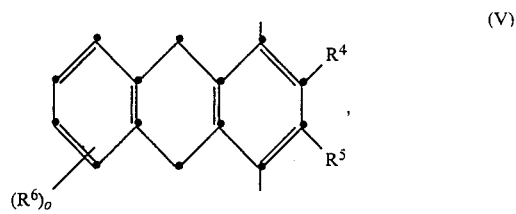

$R^2$, $R^3$, $R^4$ and $R^5$ independently of one another are hydrogen, alkyl, cycloalkyl or substituted or unsubstituted aryl or aralkyl, $R^6$ and $R^7$ independently of one another are aryl or halogen, m and n independently of one another are 0, 1 or 2 and o is 0, 1, 2, 3 or 4, it being possible for the radicals $R^1$ to $R^7$ to assume different meanings within the definitions given, and the arrows in formula I represent position isomerism.

Q as an unsubstituted or substituted tetravalent aromatic radical as a rule has 6 to 30, in particular 6 to 20, C atoms and if appropriate one or two hetero atoms, for example O, N or S.

Any substituents on the radical Q are preferably alkyl groups, in particular methyl, or halogen atoms, in particular chlorine or bromine. Unsubstituted radicals Q are preferred.

Preferred radicals Q are described in EP-A-No. 132,221.

The particularly preferred radicals Q of this type include, for example, those of the formulae

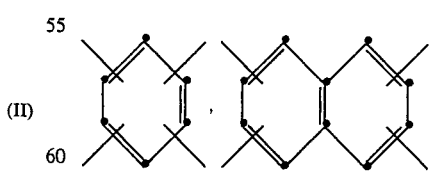

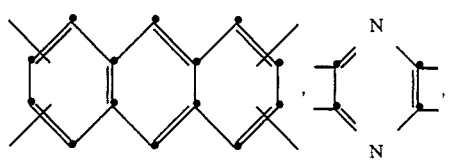

-continued

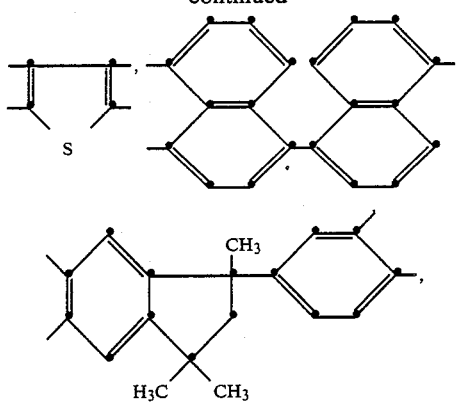

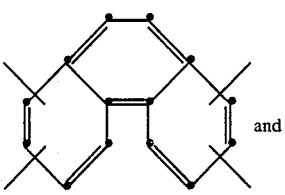

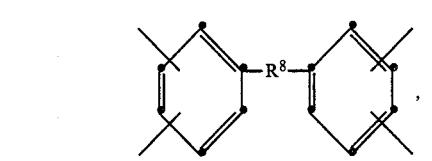

in which $R^8$ is a direct bond or a bridge group of the formula —O—, —S—, —SO$_2$—, —CH$_2$—, —C(CH$_3$)$_2$— or —CO—.

Particularly preferred radicals Q of this type are derived from benzophenonetetracarboxylic acid, in particular from the 3,3′,4,4′-derivative.

Other preferred radicals Q are described in EP-A-No. 162,017. These radicals are, in particular, groups of the formula VI

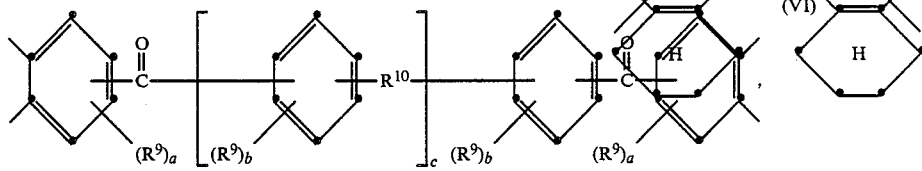

in which $R^9$ is C$_1$–C$_6$-alkyl, C$_1$–C$_6$-alkoxy, C$_1$–C$_6$-alkylthio, phenyl, phenyloxy or phenylthio, $R^{10}$ is a direct bond or a bridge group of the formula —O—, —S—, —SO$_2$—, —CH$_2$—, —C(CH$_3$)$_2$— or —CO—, a is 0, 1, 2 or 3, b is 0, 1, 2, 3 or 4 and c is 0, 1, 2, 3, 4 or 5, and, if a and b are 2, the two symbols $R^9$, in addition to being as defined above, are also bonded to one another in the o-position and together are —CH=CH—CH=CH—. The index c is preferably 0. The indices a and b are preferably 0 or 1.

Particularly preferred structural elements of this type correspond to the formula VIa and VIb

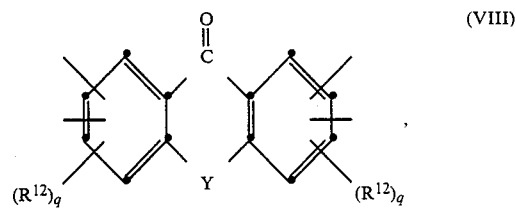

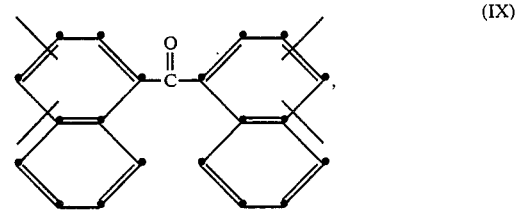

Other preferred radicals Q are described in EP-A-No. 181,837. These are preferably structures of the formulae VIII, IX, X and XI

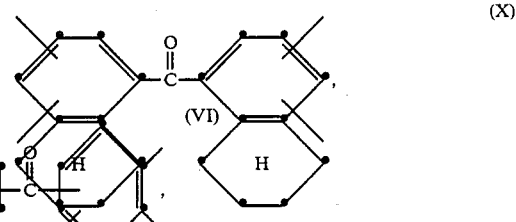

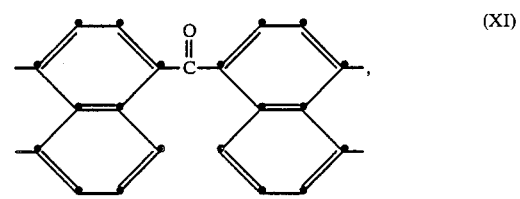

in which the free bonds are in the ortho-position relative to one another and Y is a direct bond, —CH$_2$—, —$(CH_2)_2$—, —$O$—, —$S$—, —$SO_2$—, —$CO$—, —$NR^{11}$— or —$CR^{13}R^{14}$—, in which $R^{11}$ and $R^{13}$ are hydrogen atoms, $C_1$–$C_6$-alkyl or phenyl and $R^{14}$ has the meaning of $R^{13}$, with the exception of a hydrogen atom, $R^{12}$ is $C_1$–$C_6$-alkyl, $C_1$–$C_6$-alkoxy or phenoxy and q is 0, 1 or 2. q is preferably 0.

A particularly preferred embodiment of the radicals of this type comprises structures of the formulae VIIIa, VIIIb, VIIIc and VIIId, in particular the 3,3′,4,4′-derivatives of these radicals

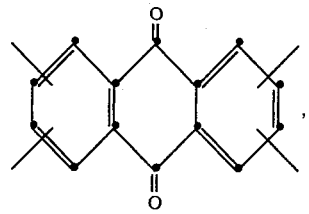

(VIIIa)

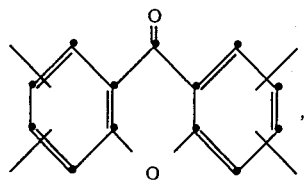

(VIIIb)

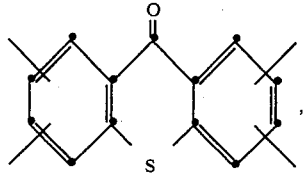

(VIIIc)

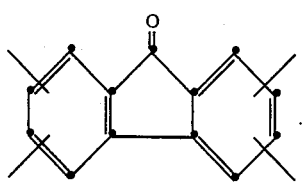

(VIIId)

If any radicals are alkyl, these are as a rule $C_1$–$C_{20}$-alkyl, preferably $C_1$–$C_6$-alkyl. The alkyl radicals can be branched or unbranched. Unbranched radicals are preferred.

Examples of $C_1$–$C_{20}$-alkyl are methyl, ethyl, n-propyl, isopropyl, n-butyl, sec.-butyl, tert.-butyl, n-pentyl, isoamyl, n-hexyl, n-heptyl, n-octyl, 2-ethylhexyl, n-nonyl, n-decyl, n-dodecyl, n-tetradecyl, n-hexadecyl, n-octadecyl or n-eicosyl.

Methyl, ethyl, n-propyl, isopropyl, n-butyl and n-hexyl, but in particular methyl, are preferred.

If any radicals are cycloalkyl, these are as a rule $C_5$–$C_7$-cycloalkyl. Examples of such radicals are cyclopentyl, cyclohexyl and cycloheptyl. Cyclohexyl is preferred.

Examples of aryl radicals are phenyl and naphthyl. Substituted aryl groups can carry, for example, alkyl groups, in particular methyl, halogen atoms, in particular chlorine, nitro groups or cyano groups as substituents. Specific examples of substituted aryl radicals are o-, m- or p-tolyl, xylyl and chlorophenyl. Phenyl is preferred.

If any radicals are aralkyl, these are as a rule $C_7$–$C_{14}$-aralkyl groups. Examples of these are benzyl, α-methylbenzyl, α,α-dimethylbenzyl and 4-methylbenzyl. Benzyl is preferred.

If any radicals are halogen, these are fluorine, chlorine, bromine or iodine. Chlorine and bromine, in particular chlorine, are preferred.

$R^9$, $R^{11}$, $R^{12}$, $R^{13}$ and $R^{14}$ as $C_1$–$C_6$-alkyl are, for example, methyl, ethyl, n-propyl, n-butyl or n-hexyl. Methyl is preferred.

$R^9$ and $R^{12}$ as $C_1$–$C_6$-alkoxy are, for example, methoxy, ethoxy, n-propoxy, n-butoxy or n-hexoxy. Methoxy is preferred.

$R^9$ as $C_1$–$C_6$-alkylthio is, for example, methylthio, ethylthio, n-propylthio, n-butylthio or n-hexylthio. Methylthio is preferred.

The indices m and n are preferably 0 or 1, particularly preferably 0. The index o is preferably 0, 1 or 2, particularly preferably 0.

The radicals $R^1$ with the formula III or IV are preferred.

Of the 9,10-dihydroanthracene radicals $R^1$, the unsubstituted radicals or those with not more than two $C_1$–$C_6$-alkyl groups, in particular those with not more than two methyl groups, are preferred.

$R^2$ and $R^3$ are preferably hydrogen or $C_1$–$C_6$-alkyl, in particular hydrogen, methyl or ethyl.

Homo- and copolyimides containing at least 30 mol %, based on the total polymer, of structural units of the formula II are preferred. Homo- and copolyimides containing at least 30 mol %, based on the total polymer, of structural units of the formula II in which the radicals $R^1$ are unsubstituted or carry not more than two $C_1$–$C_6$-alkyl substituents are particularly preferred.

Homo- or copolyimides consisting of recurring structural units of the formula II are especially preferred.

The homopolyimides with unsubstituted 9,10-dihydroanthracene radicals are as a rule insoluble and are distinguished by a particularly high stability to oxidation by heat.

The copolyamide acid (esters) according to the invention and the copolyimides can also contain other radicals of diamines $R'^1$, in addition to the 9,10-dihydroanthracene radicals $R^1$, as long as the minimum amount of structural units of the formulae I and/or II is present.

Such radicals $R'^1$ are in general derived from divalent unsubstituted or substituted aliphatic radicals which may be interrupted by hetero atoms or aromatic, heterocyclic or cycloaliphatic groups, or from unsubstituted or substituted cycloaliphatic, aromatic, heterocyclic or araliphatic groups. Examples of such diamine radicals are to be found in EP-A-No. 134,752.

The preferred cocomponents $R'^1$ include aromatic radicals of organic diamines, in particular those in which the aromatic radical is substituted by alkyl, cycloalkyl, alkoxy, alkoxyalkyl or aralkyl in the two ortho-positions relative to at least one amino group, and those in which two adjacent C atoms of the aromatic radical are substituted by alkylene. Diamines of this type are described in EP-A-No. 132,221.

Particularly preferred diamines correspond to the formulae III and IIIa of EP-A-No. 132,221.

Other preferred radicals $R'^1$ are aromatic and have an alkyl radical in the ortho-position relative to at least one amino group. Such radicals are described in EP-A-No. 134,752.

A particularly preferred group of radicals $R'^1$ corresponds to the formulae

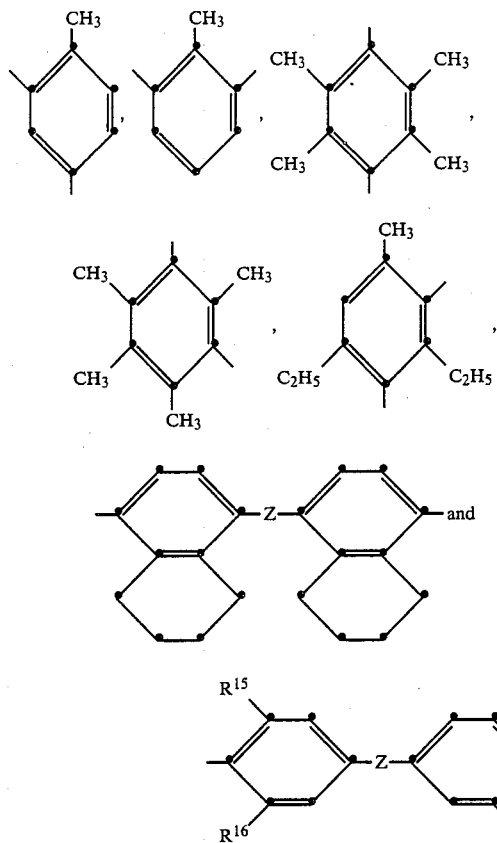

in which Z is a direct bond, —O— or, in particular, —CH$_2$—, R$^{15}$ is methyl, ethyl or isopropyl and R$^{16}$ is methyl, ethyl, isopropyl or, in particular, hydrogen.

Especially preferred radicals are those in which Z is —CH$_2$—, R$^{15}$ is isopropyl and R$^{16}$ is hydrogen.

By introducing substituted diamine radicals, preferably aliphatically substituted aromatic radicals, it is often possible to increase or establish the solubility of the polyimides (in organic solvents). However, the relationships between the structure and the solubility of polyimides have not yet been clarified beyond doubt; it must therefore be left to the expert to determine by routine tests whether the introduction of a certain diamine radical into a polyimide leads to an increase in the solubility or not.

Particularly preferred homo- or copolyimides are those containing at least 30 mol %, based on the total polymer, of structural units of the formula II and containing exclusively aromatic diamine radicals which are derived from unsubstituted or not more than di-C$_1$–C$_6$-alkyl-substituted radicals of the formula III, IV or V and if appropriate other unsubstituted or not more than tetra-C$_1$–C$_6$-alkyl-substituted aromatic diamine radicals, preferably diamine radicals with not more than four C$_1$–C$_6$-alkyl groups in the ortho-positions relative to the nitrogen atoms, the content of alkyl-substituted diamine radicals being at least high enough for the polymers to dissolve in aprotic organic solvents. A polyimide is regarded as sufficiently soluble if it dissolves to the extent of at least 0.5 g, preferably 5 g, per 100 ml of solvent. For many purposes, even lower solubilities are sufficient. Preferred solvents are dimethylformamide, dimethylacetamide, dimethylsulfoxide, N-methylpyrrolidone, hexamethylphosphoric acid amide and γ-butyrolactone.

Soluble (co)polyimides, as defined above, containing 30–100 mol %, in particular 50–100 mol %, of the structural element of the formula II in which Q is a tetravalent radical containing diaryl ketone are particularly preferred.

The term "radical containing diaryl ketone" includes all radicals which contain an aryl-CO-aryl unit in the broadest sense. The definition thus also includes quinoid systems, for example anthraquinone radicals.

Soluble (co)polyimides, as defined above, containing 30–100 mol %, in particular 50–100 mol %, of the structural element of the formula II in which Q is derived from the 3,3′,4,4′-derivatives of benzophenone-, anthraquinone-, xanthone- or thioxanthonetetracarboxylic acid or from a mixture of these acids are especially preferred.

Another preferred group of polymers according to the invention are (co)polyamide acid (esters containing 30–100 mol %, based on the total polymer, of the structural elements of the formula I in which R$^2$ and R$^3$ independently of one another are hydrogen or alkyl, but in particular are in each case hydrogen or methyl or ethyl.

The polyimides, polyamide acids, polyamide acid esters or partly cyclized polyamide acids, i.e. compounds containing structural units I and II, according to the invention have average molecular weights (weight-average $\overline{M}w$) of at least 2,000, preferably at least 5,000. The upper limit essentially depends on the properties which determine processability, for example their solubility. It can be up to 500,000, preferably 100,000 and particularly up to 60,000. They can furthermore be random polyimides or polyamide acid (derivatives) or block polyimides or polyamide acid (derivatives). They are prepared by customary processes in devices intended for this purpose.

The preparation of these homo- or copolyamide acid (esters) and the homo- or copolyimides derived therefrom with structural elements of the formula I and/or II is advantageously carried out by subjecting essentially equimolar amounts of a tetracarboxylic acid of the formula XII or one of its derivatives which form a polyamide or mixtures of these compounds

to a polycondensation reaction with a diamine of the formula XIII or mixtures thereof or mixtures of at least 5 mol %, based on the diamines, of a diamine XIII and not more than 95 mol % of a diamine XIIIa

in a manner which is known per se and if appropriate subsequently cyclizing the product, or reacting the resulting polyamide acid completely or partly with a suitable esterifying agent; the radicals Q, R$^1$ and R′$^1$ here are as defined above. Instead of the tetracarboxylic acid(s) XII, it is also possible to use their derivatives which form polyamides, for example their esters, amides, halides, in particular the chlorides, and anhydrides.

The starting compounds of the formulae XII and XIIIa are known and in some cases are commercially obtainable, whereas the diamines of the formula XIII are novel.

The present invention therefore also relates to these intermediates of the formula XIII, in particular the alkyl-substituted types. 1,5- and 1,8-diamino-9,10-dihydroanthracene are particularly preferred.

These intermediates are prepared by processes which are known per se, for example by reducing a 1,4-, 1,5- or 1,8-dinitroanthraquinone or 1,4-, 1,5- or 1,8-diaminoanthraquinone or mixtures of these compounds to the corresponding diaminoanthracene derivatives and then preparing the 9,10-dihydroanthracene derivatives by partial hydrogenation. The preparation of the dinitroanthraquinones is described, for example, in German Offenlegungsschrift No. 2,439,280. The reduction to the diaminoanthracene derivatives is carried out, for example, with Zn dust in an alkaline medium, for example in a methanol/sodium hydroxide solution mixture. The reduction can in some cases be carried out directly to the dihydroanthracene derivative stage, or the corresponding anthracene derivatives are first obtained and are then partially hydrogenated. The hydrogenation is carried out by methods which are likewise known, for example by means of Raney nickel or by catalytic hydrogenation in the presence of Pd-on-charcoal or CuO/Cr$_2$O$_3$/BaO catalysts. The preparation of the intermediates is advantageously carried out in inert solvents. The reaction temperatures are in general in the range from 25° C. to 200° C., depending on the reactants. The condensation to the polymeric end products is likewise advantageously carried out in solution; suitable inert solvents are mentioned below. The reaction temperatures here can be −20°–300° C., preferably −10°–200° C. and particularly preferably 0°–50° C.

The tetracarboxylic acid of the formula XII or one of its derivatives which forms a polyamide acid can be used as the starting material for the polycondensation.

If appropriate, the polyamide acid formed can then either be cyclized to give the corresponding polyimide, or some or all of the free carboxylic acid groups are esterified with a suitable esterifying agent, for example with an alcohol or a dialkyl sulfate, preferably with an aliphatic alcohol, such as methanol or ethanol, or with dimethyl sulfate. To prepare the polyamide acid ester, it is also possible to start from the dianhydride of the carboxylic acid XII, to esterify this with two equivalents of an alcohol, to activate the remaining two free acid groups, for example by reaction with thionyl chloride to give the acid chlorides, and to subject this product to polycondensation with a diamine.

To prepare the polyimides, a procedure is advantageously followed in which, in detail, the tetracarboxylic acid dianhydride and diamine are first reacted in a manner which is known per se to form the polyamide acid precursor and this polyamide acid is then cyclized, water being split off. The cyclization can be carried out by means of heat. The cyclization is advantageously carried out under the action of dehydrating agents, for example carboxylic acid anhydrides, such as acetic anhydride. The polyimides can then be isolated by customary processes, for example by removal of the solvent or precipitation by addition of a non-solvent. The insoluble polyimide types of this invention are applied in a manner which is known per se in the form of the polyamide acid precursor in question onto the desired substrate and then cyclized by means of heat.

Another preparation method comprises reacting the tetracarboxylic acid dianhydride with a diisocyanate in one stage to give the polyimide.

For this, essentially equimolar amounts of a dianhydride of the formula XIIa or mixtures of such compounds

(XIIa)

are reacted with a diisocyanate of the formula XIV or mixtures thereof or mixtures of at least 5 mol %, based on the diisocyanates, of a diisocyanate XIV and not more than 95 mol % of a diisocyanate XIVa

OCN—R$^1$—NCO (XIV)

OCN—R′$^1$—NCO (XIVa)

in which Q, R$^1$ and R′$^1$ are as defined above, in an inert solvent at 50° C. to 150° C.

The diisocyanates of the formulae XIV and XIVa can be prepared in a manner which is known per se from the corresponding diamines by reaction with phosgene. Examples of suitable inert solvents are polar aprotic solvents, such as dimethyl sulfoxide or dimethylformamide.

The polyimides according to the invention have elevated glass transition temperatures, which can be up to more than 500° C. Surprisingly, the polymers according to the invention are more resistant to oxidative degradation by heat at elevated temperatures than corresponding polymers without 9,10-dihydroanthracene radicals. They are thus outstandingly suitable for the production of films and protective coatings, in particular for the production of insulating and protecting layers for conducting, semi-conducting or insulating components and for the production of heat-stable films.

The polyimides according to the invention with substituted diamine radicals, the polyamide acids and the polyamide acid esters are as a rule soluble in various solvents, if necessary with warming.

Coating agents are used, in particular, in the form of solutions of the polymers according to the invention, preferably of the soluble polyimides, in a solvent.

To prepare the coating agent according to the invention, the polymer or a mixture of polymers is advantageously dissolved in a suitable organic solvent, if necessary with warming. Examples of suitable solvents are polar aprotic solvents, which can be used by themselves or as mixtures of at least two solvents. Examples are: ethers, such as dibutyl ether, tetrahydrofuran, dioxane, methylene glycol, dimethylethylene glycol, dimethyldiethylene glycol, diethyldiethylene glycol or dimethyltriethylene glycol, halogenated hydrocarbons, such as methylene chloride, chloroform, 1,2-dichloroethane, 1,1,1-trichloroethane or 1,1,2,2-tetrachloroethane, carboxylic acid esters and lactones, such as ethyl acetate, methyl propionate, ethyl benzoate, 2-methoxyethyl acetate, γ-methoxyethyl acetate, γ-butyrolactone, o-valerolactone and pivalolactone, carboxylic acid amides and lactams, such as formamide, acetamide, N-methylformamide, N,N-dimethylformamide, N,N-diethylformamide, N,N-dimethylacetamide, N,N-diethylacetamide, γ-butyrolactam, ε-caprolactam, N-methylpyrrolidone, N-acetylpyrrolidone, N-methylcaprolactam, tetramethylurea or hexamethylphosphoric acid amide, sulfoxides, such as dimethyl sulfoxide, sulfones, such as dimethyl sulfone, diethyl sulfone, trimethyl sulfone or tetramethyl sulfone, and substituted benzenes, such as chlorobenzene, o-dichlorobenzene, nitrobenzene, phenols or cresols.

Undissolved portions can be removed by filtration, preferably by pressure filtration. The concentration of polymer in the coating agent thus obtained is preferably not more than 50% by weight, in particular not more than 30% by weight and especially not more than 20% by weight, based on the solution.

Other customary additives which do not adversely influence the photosensitivity can be incorporated during the preparation of the solutions. Examples of these are matting agents, flow control agents, fine-particled fillers, flame-proofing agents, fluorescent brighteners, sensitizers, antioxidants, stabilizers, light stabilizers, dyes, pigments, adhesion promoters and antihalo dyes, such as are described, for example, in U.S. Pat. No. 4,349,619.

The coating agent can be applied to suitable substrates or carrier materials by customary methods, such as dipping, brushing and spraying processes or by whirler, cascade and curtain coating.

Examples of suitable substrates are plastics, metals and metal alloys, semi-metals, semiconductors, glass, ceramics and other inorganic materials, for example $SiO_2$ and $Si_3N_4$.

The solvent is then removed, if appropriate by warming and if appropriate in vacuo. Non-tacky, dry, uniform films are obtained. The films applied can have coating thicknesses of up to about 500 μm or more, depending on their use.

It has been found that the polymers according to the invention are autophotocrosslinkable and can be crosslinked under the action of radiation if they contain at least 5 mol % of structural elements of the formula I and/or II, in which Q is a radical of an arylketonetetracarboxylic acid. Since the photosensitivity increases as the content of such structural elements increases, a content of at least 30 mol %, preferably at least 50 mol % and especially at least 80 mol %, is advantageous.

Protective films of such polyimides can be further modified by the action of radiation, whereupon, for example, even higher stabilities to heat can be achieved. There is also the possibility of using the soluble representatives of these polyimides as a photographic recording material for relief images. The polymer layer of the material according to the invention has a photosensitivity which is sufficient for many uses and in some cases is high, and it can be photocrosslinked directly. By direct crosslinking under the action of radiation, additives such as sensitizers can be avoided and the protective coatings, images and films have excellent electrical properties. Sensitizers can nevertheless also be used. The protective coatings, images and films are furthermore distinguished by a high adhesive strength and thermal, mechanical and chemical resistance. On aftertreatment with heat, only slight shrinkage is observed, which has considerable advantages during use because virtually no distortion of the imaged structures is found or no internal stresses develop in coatings and films.

The material is stable on storage but should advantageously be protected from the action of light.

The invention also relates to coating agents which contain, in solution, a polymer which is sensitive to radiation, as defined above, i.e. a soluble polyimide, a polyamide acid or a polyamide acid ester with the structural elements I and/or II or mixtures of such polymers.

The invention furthermore relates to a carrier material coated with such polymers and the use of these polymers for the production of insulating, passivating and protective coatings, relief images and heat-stable films. The coating thickness for these applications is preferably 0.5 to 100 μm, in particular 1 to 50 μm and especially 1–10 μm.

Photostructuring or photocrosslinking can be brought about by high-energy radiation, for example by light, in particular in the UV range, or by X-rays, laser light or electron beams.

The invention also relates to the coatings and films crosslinked by radiation.

Fields of use are, for example, protective, insulating and passivating varnishes in electrical engineering and electronics, photomasks for electronics, textile printing and the graphics industry, etch resist for the production of printed circuits, printed circuit boards and integrated circuits, relays for the production of X-ray masks, solder-stopping lacquer, dielectrics for multi-layer circuits and structural elements for liquid crystal displays.

Protective films are as a rule produced by direct exposure, and the exposure times essentially depend on the coating thicknesses and photosensitivity and can be determined by the expert by customary processes.

Photographic production of the relief structure is carried out in a manner which is known per se by image-wise exposure through a photomask and subsequent development to remove the non-exposed portions with a solvent or a solvent mixture, after which the image produced can be stabilized by aftertreatment with heat, if appropriate.

The invention furthermore relates to the relief structures obtainable by these processes. Suitable developers are, for example, the abovementioned solvents.

The following examples illustrate the invention in more detail.

PREPARATION EXAMPLES

Preparation of the diamines

Example A: 1,5-Diamino-9,10-dihydroanthracene

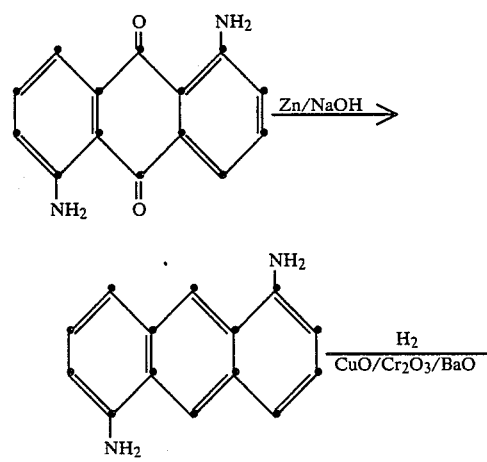

-continued

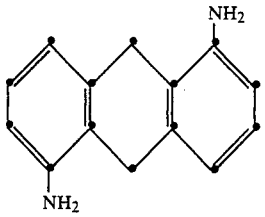

100 g of 1,5-diaminoanthraquinone are taken in a mixture of 10 l of water, 1 l of 25% NaOH and 1 l of n-propanol, and 100 g of zinc powder are added. The mixture is refluxed and 400 g of zinc powder are added in the course of 2.5 hours.

After a further 2 hours under reflux, 500 ml of 25% NaOH and 300 g of zinc are added. After 20 hours under reflux, the reaction mixture is cooled and filtered and the solid residue is extracted continuously with methylene chloride for 24 hours under nitrogen.

The extract is evaporated and the solid residue is dried.

This intermediate is not characterized in more detail. It is subjected to catalytic hydrogenation in 1.5 L of methanol with hydrogen in the presence of a CuO/Cr$_2$O$_3$/BaO catalyst (Girdeler; G-22-T) at 100° C. under 100 bar until the uptake of hydrogen stops. The reaction mixture is filtered and the residue is extracted several times with boiling ethanol. The collected extracts are evaporated to dryness and the residue is recrystallized from 2 l of isopropanol.

20.5 g of 1,5-diamino-9,10-dihydroanthracene are obtained.

Purity according to acidimetric titration: 99.48%
Melting point: 179.4° C.
Elemental analysis: calculated C 79.97, H 6.71, N 13.32, found C 79.84, H 6.77, N 13.20. MS. 210.

Example B: Preparation of 1,5- and 1,8-diamino-9,10-dihydroanthracene

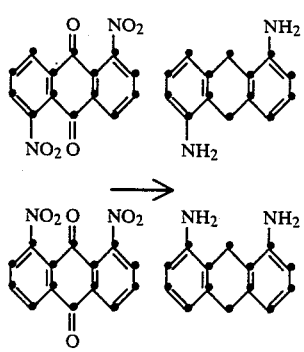

10 g of a dinitroanthraquinone mixture according to the example in Houben-Weyl, Volume VII/3c, page 75 (G. Thieme VerLag, 1979) are reduced with Zn dust in accordance with Example 1. The residue of the organic phase (6.5 g) is stirred with 25 ml of chloroform and filtered off. Crystallization of the filtered material (1.2 g) from 35 ml of isopropyl alcohol gives 0.52 g of 1,5-diamino-9,10-dihydroanthracene,
melting point 178°–179° C.

Calculated C 79.97%, H 6.71%, N 13.32%, Found C 79.70%, H 6.70%, N 13.3%.

Chromatography of the residue of the filtrate on 200 g of silica gel with CHCl$_3$/CH$_3$OH=9:1 (parts by volume) as the eluting agent gives a further 1.1 g of 1,5-diamino-9,10-dihydroanthracene (R$_f$: 0.5) and 1.5 g of 1,8-diamino-9,10-dihydroanthracene (R$_f$: 0.2).

Example C: Preparation of 1,8-diamino-9,10-dihydroanthracene

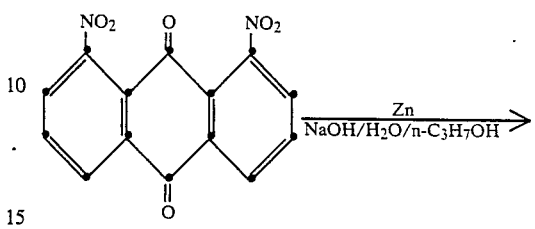

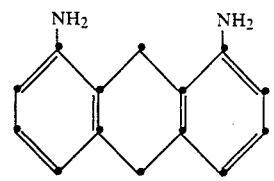

210 g of zinc dust are added in three portions (2nd portion after 2 hours, 3rd portion after 3 hours) to a suspension of 48 g (0.161 mol) of 1,8-dinitroanthraquinone in 1.3 l of water, 300 ml of n-propyl alcohol and 300 ml of 30% NaOH at the boiling point. The mixture is stirred and refluxed for 18 hours. After addition of 1 l of chloroform, it is filtered, and the organic phase is separated off, washed with saturated sodium chloride solution, dried with MgSO$_4$ and evaporated.

Chromatography of the residue on 700 g of silica gel with chloroform/methanol=9:1 (parts by volume) as the eluting agent gives 17 g of 1,8-diamino-9,10-dihydroanthracene.

Melting point (toluene): 138°–139°
Calculated C 79.97%, H 6.71%, N 13.32%, Found C 80.10%, H 7.00%, N 13.1%.

Preparation of the polymers

EXAMPLE 1

0.73 g (0.006 mol) of 2,4-diaminotoluene and 0.84 g (0.004 mol) of 1,5-diamino-9,10-dihydroanthracene (Example A) are dissolved in 39 ml of N-methylpyrrolidone in a cylindrical stirred vessel with a stirrer, dropping funnel, internal thermometer, gas inlet tube and gas outlet tube, and the solution is cooled to 0° C., while simultaneously passing in nitrogen. 3.22 g of 3,3',4,4'-benzophenonetetracarboxylic acid dianhydride (0.01 mol) are added to this solution and the cooling is removed.

After 5 hours, a solution of 3 ml of triethylamine and 8.5 ml of acetic anhydride is added dropwise and the mixture is stirred for 18 hours. The polymer solution is poured onto water and the polyimide is filtered off, washed with a large amount of water and dried.

The intrinsic viscosity, measured as a 0.5 percent solution in N-methylpyrrolidone, is 0.72 dl/g.

The glass transition temperature (DSC) is 334° C.

EXAMPLES 2–6

Various diamines are reacted with 3,3',4,4'-benzophenonetetracarboxylic acid dianhydride to give (co)-polyimides in accordance with Example 1. The results are to be found in the following table.

| Example | Diamine | intrinsic η | Tg (°C.) (DSC) |
|---|---|---|---|
| 2 | Diamine from Example A (50 mol %); H₂N—⟨⟩—CH₂—⟨⟩—NH₂ (50 mol %) with CH(CH₃)₂ substituents | 1.06 | 305 |
| 3 | Diamine from Example A (50 mol %); H₂N—(naphthyl)—CH₂—(naphthyl)—NH₂ (50 mol %) | 1.04 | 349 |
| 4 | Diamine from Example A (50 mol %); H₂N—⟨⟩—CH₂—⟨⟩—NH₂ (50 mol %) with H₃C, C₂H₅ and CH₃, C₂H₅ substituents | 0.80 | 322 |
| 5 | Diamine from Example A (50 mol %); diaminobenzene with CH₃, C₂H₅, H₅C₂ substituents (50 mol %) | 0.60 | 376 |
| 6 | Diamine from Example A (100 mol %) | — | * |

*No glass transition can be detected in the DSC experiment up to a temperature of 655° C.

EXAMPLES 7 and 8: (Polyamide acid and polyamide acid ester)

3.22 g (0.01 mol) of 3,3',4,4'-benzophenonetetracarboxylic acid dianhydride are reacted with 2.115 g (0.01 mol) of 1,5-diamino-9,10-dihydroanthracene in N-methylpyrrolidone to give the polyamide acid in accordance with Example 1. In deviation from Example 1 the polyamide acid is not cyclized with acetic anhydride and triethylamine to give the polyimide, but some of the polyamide acid (Example 7) is removed from the vessel directly for the exposure experiments and the remainder (Example 8) is esterified with 3.4 g (0.022 mol) of diethyl sulfate and 3 g (0.022 mol) of potassium carbonate to give the corresponding polyamide acid ethyl ester.

EXAMPLE 9

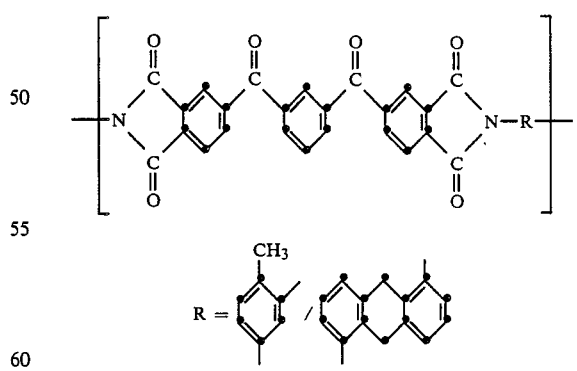

0.7327 g (0.006 mol) of 2,4-diaminotoluene and 0.8411 g (0.004 mol) of 1,5-diamino-9,10-dihydroanthracene are dissolved in 39 ml of N-methylpyrrolidone in a cylindrical stirred vessel with a stirrer, dropping funnel, internal thermometer, gas inlet tube and gas outlet tube, and the solution is cooled to 0° C., while simultaneously passing in nitrogen. 4.2533 g (0.010 mol) of 4,4'-isophthaloyl-bisphthalic acid anhydride are added to this solution and the cooling is removed.

After 5 hours, a solution of 3 ml of triethylamine and 8.5 ml of acetic anhydride is added dropwise and the mixture is stirred for 18 hours. The polymer solution is poured onto water and the polyimide is filtered off, rinsed with water and dried in vacuo.

Yield: 5.28 g

Intrinsic viscosity: 0.244 dl/g (measured at 25° C. in a 0.5% solution in N-methylpyrrolidone).

EXAMPLE 10

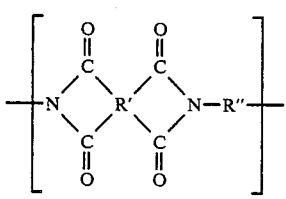

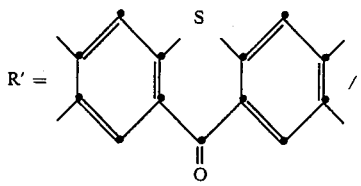

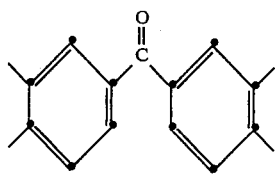

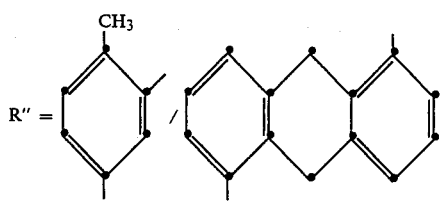

0.7326 g (0.006 mol) of 2,4-diaminotoluene and 0.8411 g (0.004 mol) of 1,5-diamino-9,10-dihydroanthracene are dissolved in 39 ml of N-methylpyrrolidone in a cylindrical stirred vessel with a stirrer, dropping funnel, internal thermometer, gas inlet tube and gas outlet tube, and the solution is cooled to 0° C., while simultaneously passing in nitrogen. 0.7045 g (0.002 mol) of thioxanthonetetracarboxylic acid dianhydride are added to this solution and the cooling is removed. After 2 hours at room temperature, 2.5778 g (0.008 mol) of benzophenonetetracarboxylic acid dianhydride are added. After 5 hours, a solution of 3 ml of triethylamine and 8.5 ml of acetic anhydride is added dropwise and the mixture is stirred for 18 hours. The polymer solution is poured onto water and the polyimide is filtered off, rinsed with water, filtered and dried in vacuo.

Yield: 4.5 g

Intrinsic viscosity: 0.61 dl/g (measured at 25° C. in a 0.5% solution in N-methylpyrrolidone).

Use Examples

I. Production of relief images

On a sheet of plastic laminated with copper on one side, a thin (about 1–2 μm) film of polymer is produced by whirler coating with a 5% polymer solution and then removing the solvent in a circulating air oven. N-Methylpyrrolidone is used as the solvent.

The sheets coated in this way are exposed through a photomask (Stouffer wedge) at room temperature with a 1000 watt UV lamp from a distance of 18 cm. The exposed sheets are then developed with a solvent, the non-exposed portions of the polymer film being dissolved away. The relief image is then visualized by etching away the exposed copper layer with $FeCl_3$ solution. The results can be found in the following table.

| Polymer according to Example | Exposure time (seconds) | Sensitivity (Stouffer scale) |
|---|---|---|
| 1 | 30 | 5 |
| 2 | 30 | 6 |
| 3 | 20 | 4 |
| 4 | 5 | 5 |
| 5 | 30 | 5 |
| 6 | 60 | 8 |
| 7 | 60 | 8 |

II. Stability to oxidation by heat

The weight loss which occurs when the material is kept isothermally in air at 400° C. for 60 minutes is measured.

Polymer from Example 1: 1.9% by weight
Polymer from Example 5: 9.9% by weight
Polymer from Example 6: 1.0% by weight
Polymer from Example 9: 2.3% by weight
Polymer from Example 10: 1.0% by weight III. Detection of the photosensitivity of selected polymers The procedure is as described under Example I and a polymer film is exposed through a photomask (Stouffer wedge). After development with N-methylpyrrolidone, the non-exposed portions of the polymer film are dissolved away. The results are to be found in the following table.

| Polymer according to Example | Exposure time (minutes) | Sensitivity (Stouffer scale) |
|---|---|---|
| 9 | 5 | 2 |
| 10 | 3 | 4 |

What is claimed is:

1. A homo- or copolyamide acid (ester) or homo- or copolyimide derived therefrom containing at least 5 mol % of structural units of the formula I and/or II

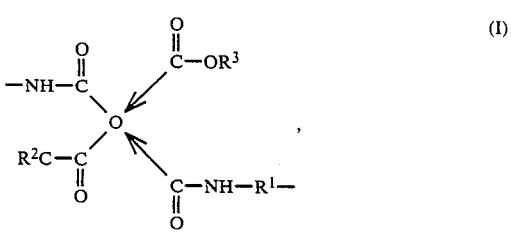

-continued

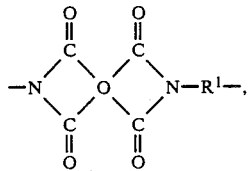
(II)

in which Q is an unsubstituted or substituted tetravalent aromatic radical to which in each case two carbonyl groups are bonded in the ortho- or peri-position, $R^1$ is selected from the group consisting of radicals of the formulae III, IV and V

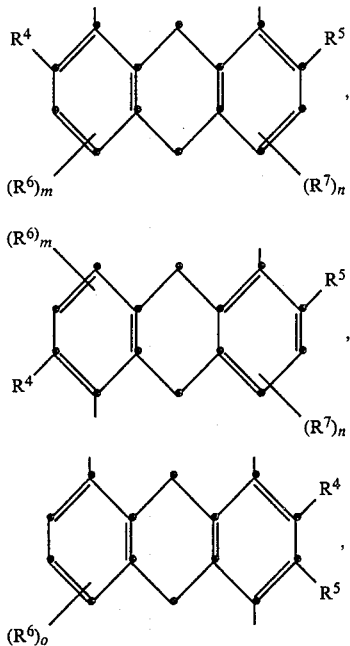

$R^2$, $R^3$, $R^4$ and $R^5$ independently of one another are hydrogen, alkyl, cycloalkyl or substituted or unsubstituted aryl or aralkyl, $R^6$ and $R^7$ independently of one another are aryl or halogen, m and n independently of one another are 0, 1 or 2 and o is 0, 1, 2, 3 or 4, it being possible for the radicals $R^1$ to $R^7$ to assume different meanings within the definitions given, and the arrows in formula I represent position isomerism.

2. A compound according to claim 1, in which the radical Q is selected from the structures

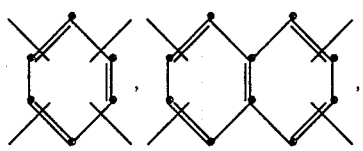

-continued

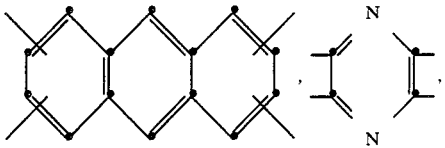

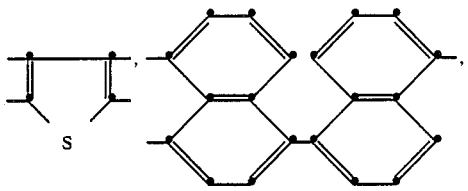

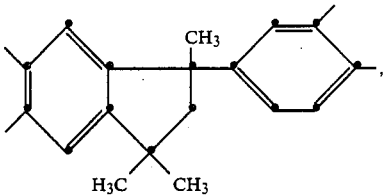

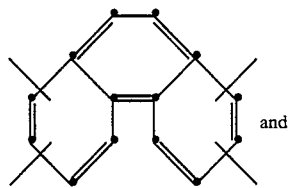

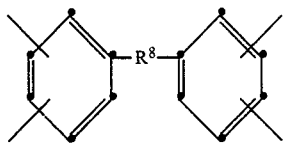

in which $R^8$ is a direct bond or a bridge group of the formula —O—, —S—, —SO$_2$—, —CH$_2$, —C(CH$_3$)$_2$— or —CO—.

3. A compound according to claim 1, in which Q is derived from benzophenonetetracarboxylic acid.

4. A compound according to claim 1, in which the radical Q is selected from the group comprising
(a) the structures of the formula VI

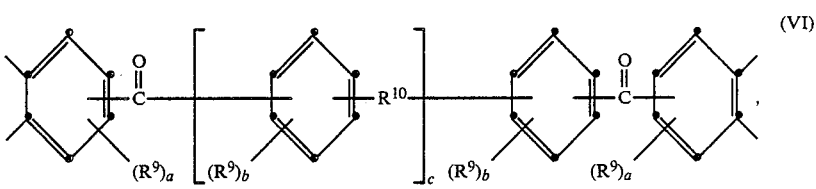
(VI)

in which $R^9$ is $C_1$-$C_6$-alkyl, $C_1$-$C_6$-alkoxy, $C_1$-$C_6$-alkylthio, phenyl, phenyloxy or phenylthio, $R^{10}$ is a direct bond or a bridge group of the formula —O—, —S—, —SO$_2$—, —CH$_2$—, —C(CH$_3$)$_2$— or —CO—, a is 0, 1, 2, or 3, b is 0, 1, 2, 3, or 4 and c is 0, 1, 2, 3, 4 or 5, and, if a and b are 2, the two symbols $R^9$, in addition to being as defined above, are also bonded to one another in the o-position and together are —CH=CH—CH=CH—, and
(b) the structures of the formulae VIII, IX, X and XI

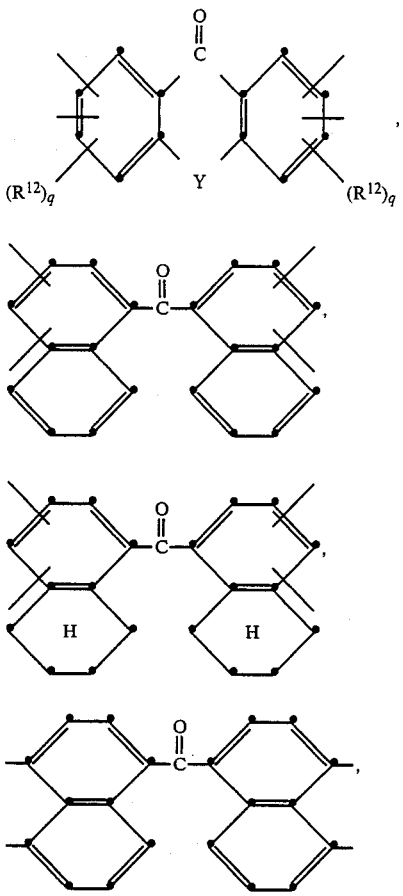

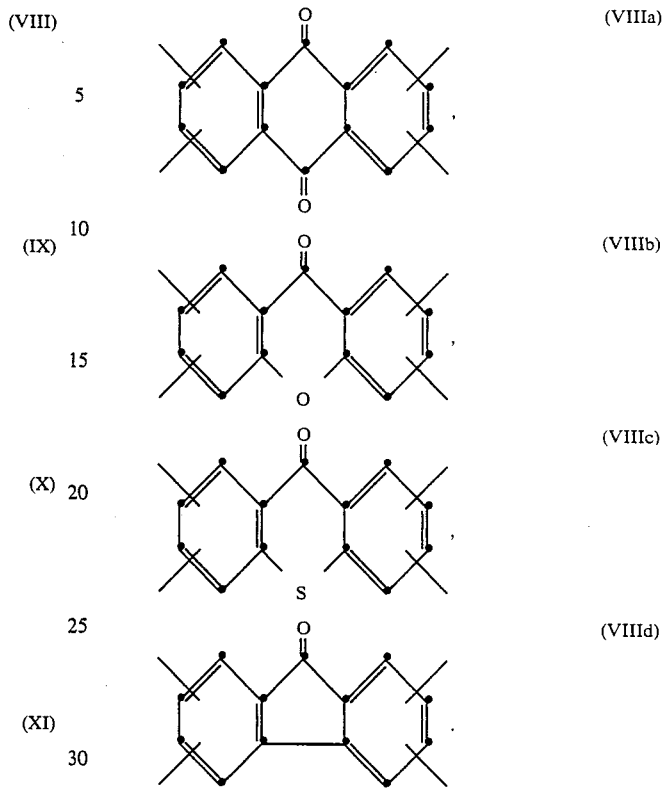

in which the free bonds are in the ortho-position relative to one another and Y is a direct bond, —CH$_2$—, —(CH$_2$)$_2$—, —O—, —S—, —SO$_2$—, —CO—, —NR$^{11}$— or —CR$^{13}$R$^{14}$—, in which R$^{11}$ and R$^{13}$ are hydrogen atoms, C$_1$–C$_6$-alkyl or phenyl and R$^{14}$ has the meaning of R$^{13}$, with the exception of a hydrogen atom, R$^{12}$ is C$_1$–C$_6$-alkyl, C$_1$–C$_6$-alkoxy or phenoxy and q is 0, 1 or 2.

5. A compound according to claim 4, in which Q is selected from the group comprising
(a) the radicals of the formulae VIa and VIb

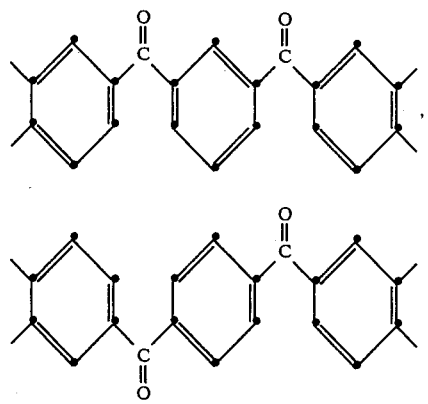

and
(b) the radicals of the formulae VIIIa, VIIIb, VIIIc or VIIId

6. A homo- or copolyimide containing at least 30 mol %, based on the total polymer, of structural units of the formula II according to claim 1, in which the radicals R$^1$ are unsubstituted or carry not more than two C$_1$–C$_6$-alkyl substituents.

7. A homo- or copolyimide consisting of recurring structural units of the formula II according to claim 1.

8. A compound according to claim 6, containing exclusively aromatic diamine radicals which are derived from unsubstituted or not more than di-C$_1$–C$_6$-alkyl-substituted radicals of the formula III, IV or V and if appropriate other unsubstituted or not more than tetra-C$_1$–C$_6$-alkyl-substituted aromatic diamine radicals, the content of alkyl-substituted diamine radicals being at least high enough for the polymers to dissolve in aprotic organic solvents.

9. A compound according to claim 8, in which Q is a tetravalent radical containing diaryl ketone.

10. A copolyamide acid (ester) containing 30–100 mol %, based on the total polymer, of structural elements of the formula I according to claim 1, in which R$^2$ and R$^3$ independently of one another are hydrogen or alkyl.

11. A compound of the formula XIII $$H_2N-R^1-NH_2 \qquad (XIII)$$

in which R$_1$ is a radical of the formula III, IV or V according to claim 1.

12. A coating agent containing, in solution, a polymer according to claim 1 which is sensitive to radiation or a mixture of such polymers.

13. A carrier material coated with a polymer according to claim 1 which is sensitive to radiation or with a mixture of such polymers.

14. A method of using a polymer according to claim 1 for the production of insulating, passivating and protective coatings, relief images and heat-stable films.

15. A coating or film obtainable by crosslinking of a polymer according to claim 1 by radiation.

16. A relief structure obtainable by image-wise exposure of a polymer according to claim 1.

* * * * *